United States Patent

Iida et al.

[11] 4,267,517
[45] May 12, 1981

[54] OPERATIONAL AMPLIFIER

[75] Inventors: Tetsuya Iida, Yokohama; Chikara Sato, Kawasaki; Yasoji Suzuki, Ayase, all of Japan

[73] Assignee: Tokyo Shibaura Denki Kabushiki Kaisha, Japan

[21] Appl. No.: 965,475

[22] Filed: Dec. 1, 1978

[30] Foreign Application Priority Data

Dec. 7, 1977 [JP] Japan .............................. 52/146793
Dec. 7, 1977 [JP] Japan .............................. 52/146794
Dec. 7, 1977 [JP] Japan .............................. 52/146795
Feb. 13, 1978 [JP] Japan .............................. 53/15238

[51] Int. Cl.³ .................... H03F 3/45; H03F 3/30; H03F 3/16
[52] U.S. Cl. .................................. 330/253; 330/255; 330/257; 330/258; 330/264
[58] Field of Search .............. 330/253, 255, 257, 258, 330/261, 264, 269, 277

[56] References Cited

U.S. PATENT DOCUMENTS

| 4,048,575 | 9/1977 | Musa | 330/253 |
| 4,050,030 | 9/1977 | Russell | 330/253 X |
| 4,152,663 | 5/1979 | Van de Sande | 330/253 |

OTHER PUBLICATIONS

Musa et al., "A CMOS Monolithic 3½ Digit A/D Converter", *1976 IEEE International Solid State Circuits Conference*, Feb. 19, 1976 pp. 144–145.

Primary Examiner—James B. Mullins
Attorney, Agent, or Firm—Finnegan, Henderson, Farabow, Garrett & Dunner

[57] ABSTRACT

An operational amplifier is provided with a differential amplifier constructed by MOS transistors and a linear amplifier constructed by MOS transistors and coupled with the differential amplifier. The differential amplifier is supplied with first and second inputs. The output of the operational amplifier is derived from the output of the linear amplifier. A stabilizing circuit, which is coupled with the differential and linear amplifiers, stabilizes the output of the operational amplifier against a variation of the input DC levels to the differential amplifier.

10 Claims, 8 Drawing Figures

OPERATIONAL AMPLIFIER

The invention relates to an operational amplifier in which a differential amplifier circuit and a linear amplifier circuit are constructed by using MOS (metal oxide semiconductor) transistors.

A fully MOS-transistorized operational amplifier has many advantages. In the case of bipolar type transistors, the base-emitter voltage $V_{BE}$ and the current amplification factor $h_{FE}$ depend largely on temperature. The temperature coefficient of the current flow in bipolar transistors is positive. This type transistor tends to fail in a thermal runaway. In the case of MOS transistors, there is an operative region where the temperature coefficient of current is zero. If the transistor operates at the operative region, the temperature coefficient is negative so long as the transistor operates in the saturation region. Therefore, thermal runaway is avoidable, unlike in the bipolar transistor. The bipolar transistor needs a relatively larger input bias current. In the case of the MOS transistor, a gate electrode is provided through an insulating layer so that the input impedance is very high and hence the input bias current is in the order of a picoampere (PA). The MOS transistor is well adapted for integrated circuit fabrication, compared to the bipolar transistor. A small area of chip is satisfactory for operational amplifier fabrication.

Because of the advantages mentioned above, many attempts have been made to use MOS transistors for constructing an operational amplifier and some examples of MOS transistorized operational amplifiers have been proposed. In one of the MOS-transistorized operational amplifiers proposed, a constant current circuit, a differential amplifier circuit and a linear amplifier circuit are used and those are all MOS-transistorized. The threshold voltages $V_{th}$ of the individual MOS transistors are varied during the manufacturing step. Accordingly,, differential amplifiers constructed solely by MOS transistors suffer from a variation of the input offset-voltages. In such an operational amplifier constructed by using only a differential amplifier fully MOS-transistorized and a linear amplifier circuit fully MOS-transistorized, change of input DC voltage levels applied to the inputs of the differential amplifer directly influences the output level of the linear amplifier circuit, i.e. the operational amplifier per se. In such a case, it is very difficult to keep the output level of the operational amplifier constant.

A brief description will be given about the relation between the inputs and outputs of a differential amplifier. With designations of $IN_1$ for the first input of the operational amplifier and $IN_2$ for the second input, the output $V_{ol}$ of the differential amplifier is given $$V_{ol} = K(IN_2 - IN_1) + V_B$$

where K is a gain of the differential amplifier and $V_B$ is a value defined in accordance with a power source voltage. As seen from the equation, an ideal differential amplifier circuit produces an output having a DC level equal to the fixed value $V_B$ when the first and second inputs $IN_1$ and $IN_2$ are equal in DC level.

However, even when both the input DC levels are equal, the output value $V_{ol}$ changes in accordance with the DC input levels. The operational amplifier with the second input $IN_2$ at a fixed reference voltage level may be considered to be a linear amplifier circuit with respect to the first input $IN_1$. As just mentioned, the potential of the output $V_{ol}$ of the differential amplifier depends on the DC voltage level of the input $IN_2$. For this, the circuit threshold voltage (referred to as a circuit Vth) of the differential amplifier is determined by the second input DC voltage $IN_2$. The circuit Vth in the differential amplifier circuit is defined to be the level of the output voltage $V_{ol}$ of the differential amplifier when the DC levels of the inputs $IN_1$ and $IN_2$ are equal to each other. Preferably, the output $V_{ol}$ is amplified in the region permitting the linear amplifier circuit succeeding to the differential amplifier circuit to effect its amplifying operation at a high gain. If the circuit Vth in the linear amplifier circuit is constant, the DC output voltage level of the output $V_{ol}$ of the differential amplifier does not coincide with the circuit Vth of the linear amplifier circuit at some DC voltage levels of the input $IN_2$. Accordingly, the linear amplifier circuit can not amplify minute variations of the output voltage $V_{ol}$. In other words, the voltage gain of the operational amplifier is reduced. The circuit Vth of the linear amplifier circuit succeedingly connected is the input or output voltage value when the input and output of the linear amplifier circuit are equal. Therefore, in order to widen the range of the input voltage of the differential amplifier, i.e. the dynamic range, it is necessary to minimize the difference between the DC voltage level of the output $V_{ol}$ and the circuit Vth of the linear amplifier circuit. To this end, it is desirable to provide a circuit $V_{th}$ matching circuit to change the circuit $V_{th}$ of the linear amplifier circuit following the output of the differential amplifier. The circuit $V_{th}$ matching circuit is provided between the differential amplifier and the linear amplifier circuits. It is further desirable to keep substantially constant the output level of the operational amplifier circuit, when the DC voltage levels of the inputs $IN_1$ and $IN_2$ change. To this end, an offset voltage compensating circuit to reduce an output voltage level change of the differential amplifier arising from the DC level change of the inputs $IN_1$ and $IN_2$, may be provided between the differential amplifier and the linear amplifier.

The offset compensating circuit and/or the circuit $V_{th}$ compensating circuit may be used as a stabilizing circuit for keeping substantially constant the output level of the operational amplifier circuit, when inserted between the differencial amplifier circuit and the linear amplifier circuit.

Accordingly, an object of the invention is to provide an operational amplifier constructed by using MOS transistors.

Another object of the invention is to provide an operational amplifier having a stabilizing circuit for stabilizing the output of the operational amplifier.

According to the invention, there is provided an operational amplifier circuit comprising: a differential amplifier circuit constructed by using MOS transistors, connected between a first potential supply terminal and a second potential terminal, and supplied with first and second inputs; a linear amplifier circuit constructed by using MOS transistors, connected between the first and second potential supply terminals, and supplied with an output of the differential amplifier circuit to produce an output corresponding to the output of the differential amplifier circuit; and a stabilizing circuit which is connected to the first and second potential supply terminals, the differential amplifier circuit and the linear amplifier circuit, for stabilizing the output of the linear amplifier circuit.

Other objects and features of the invention will be apparent from the following description in connection with the accompanying drawings, in which.

Figure 7:
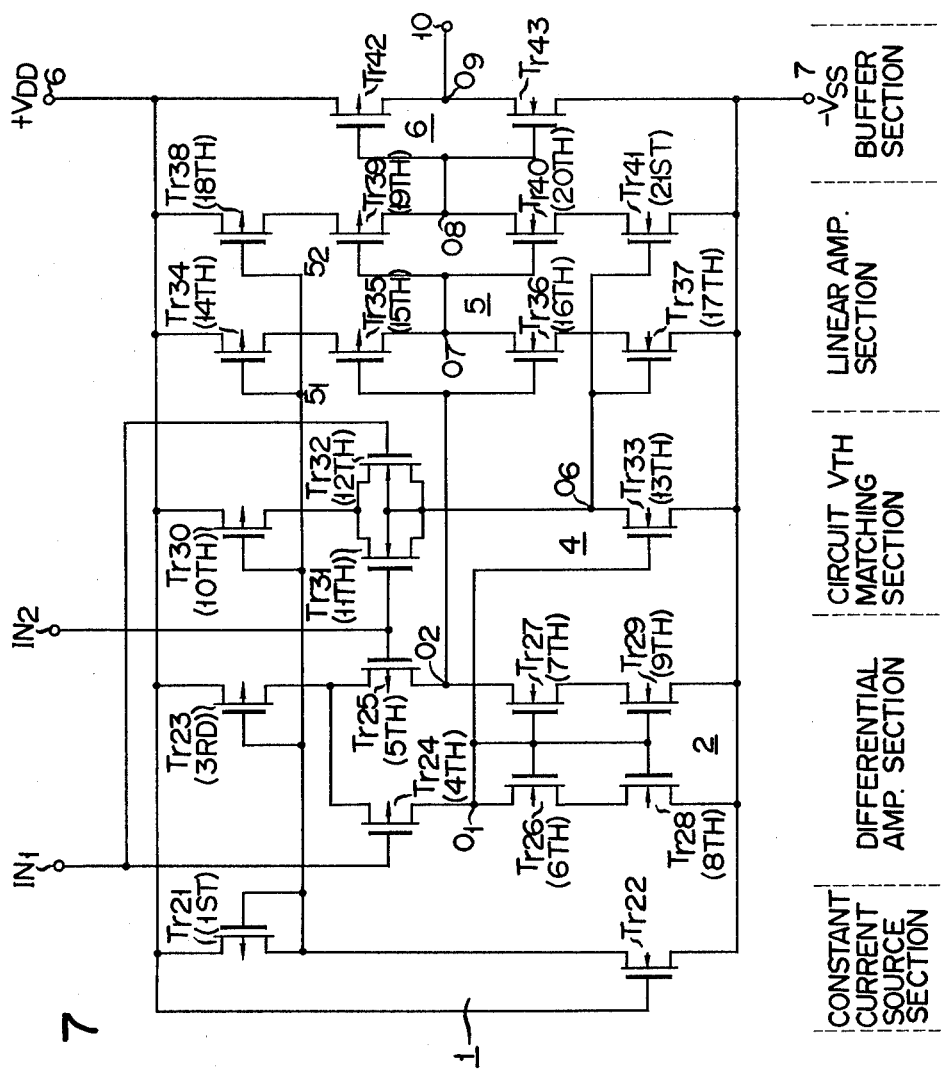
Figure 8:
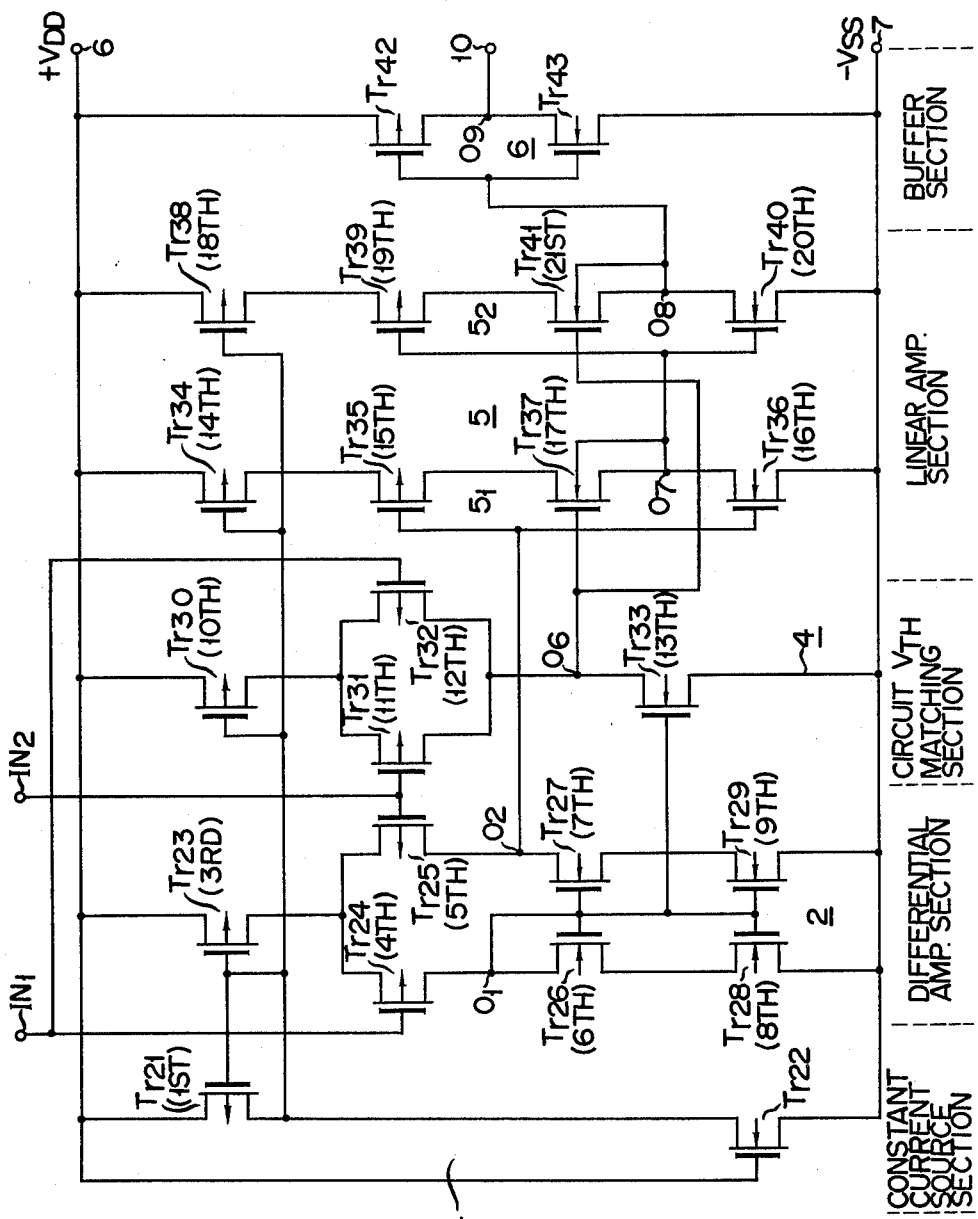

FIG. 7 shows a circuit diagram of a seventh embodiment of an operational amplifier circuit according to the invention, in which a stabilizing circuit includes a circuit threshold voltage matching circuit; and FIG. 8 shows a circuit diagram of an eighth embodiment of an operational amplifier circuit according to the invention, in which some of the MOS transistors in FIG. 7 are replaced by MOS transistors with a different channel type.

Figure 1:
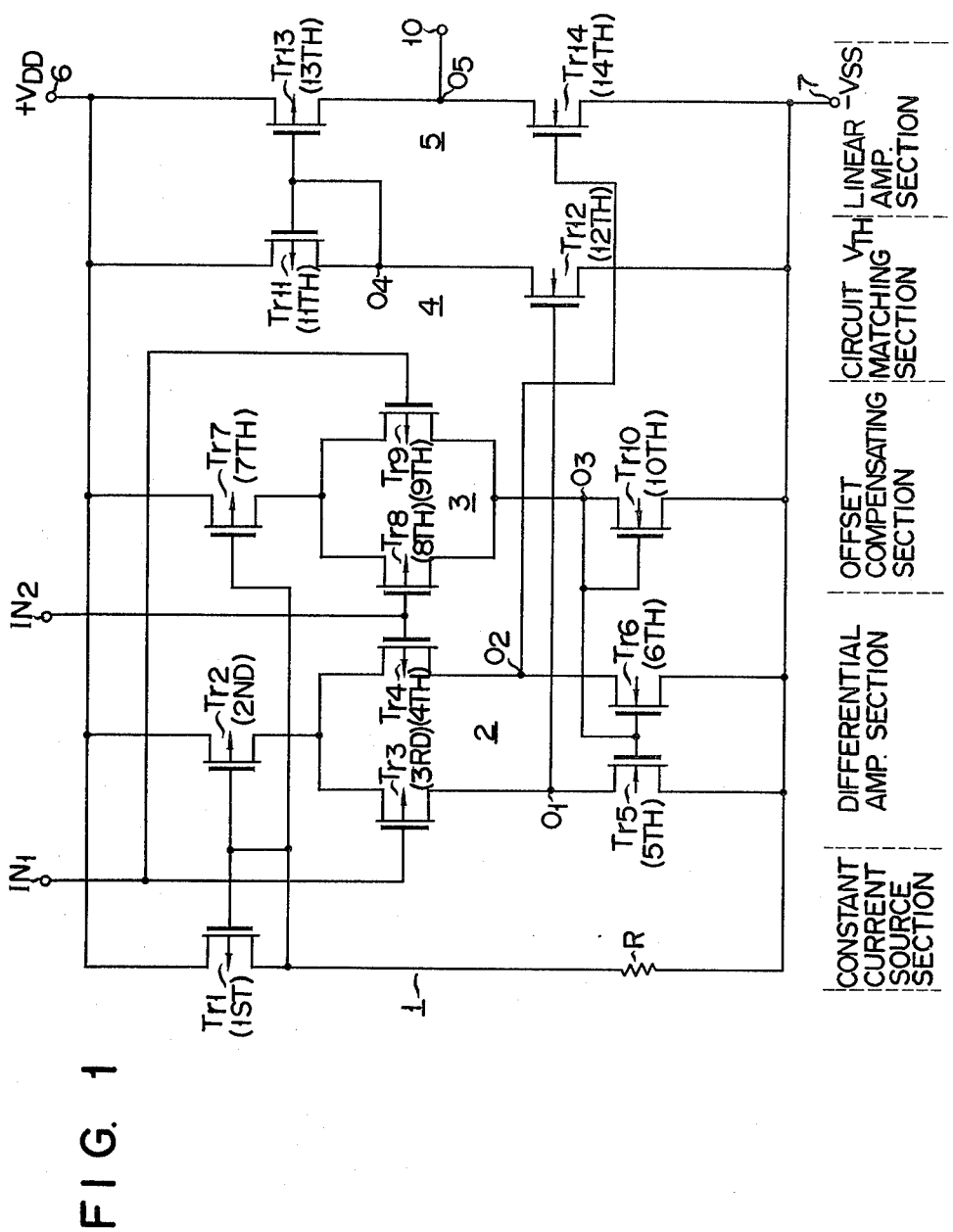
FIG. 1 shows a circuit diagram of a first embodiment of an operational amplifier according to the invention, in which a stabilizing circuit includes an offset compensating circuit and a circuit threshold voltage matching circuit.

Reference is first made to FIG. 1 illustrating a first embodiment of an operational amplifier circuit according to the invention. In the figure, the operational amplifier comprises a constant current source circuit 1, a differential amplifier circuit 2, an offset compensating circuit 3, a circuit threshold voltage matching circuit 4 and a linear amplifier circuit 5. The circuits 1 to 5 are constructed by using MOS transistors.

In the constant current source circuit 1, a P-channel MOS transistor $T_{r1}$ is connected at the source terminal to the supply terminal 6 of a first potential ($+V_{DD}$), at the drain terminal to the supply terminal 7 of a second potential ($-V_{SS}$) via a resistor R and at the gate to the drain terminal of the same transistor. A constant voltage is derived from the connection point of the gate and drain terminals.

In the differential amplifier circuit 2, a P-channel MOS transistor $T_{r2}$ serving as a constant current source is connected at the source terminal to the first potential supply terminal 6, at the drain terminal to the source terminals of P-channel MOS transistors $T_{r3}$ and $T_{r4}$ forming an input stage of the differential amplifier circuit. The transistors $T_{r3}$ and $T_{r4}$ are connected at the drains to the second potential supply terminal 7, through N-channel load MOS transistors $T_{r5}$ and $T_{r6}$. The gate of the transistor $T_{r2}$ is connected to the drain terminal of the transistors $T_{r1}$. The gate of the transistor $T_{r3}$ is connected to the first input terminal $IN_1$ of the operational amplifier. The gate of the transistor $T_{r4}$ is connected to the second input terminal $IN_2$ of the operational amplifier. The gates of the transistors $T_{r5}$ are $T_{r6}$ are connected to each other. In the figure, characters $O_1$ and $O_2$ designate first and second output terminals of the differential amplifier.

In the offset compensating circuit 3, a P-channel MOS transistor $T_{r7}$ serving as a constant current source is connected at the source terminal to the first potential supply terminal 6, and at the drain terminal to the source terminals of a pair of P-channel MOS transistors $T_{r8}$ and $T_{r9}$. These transistors $T_{r8}$ and $T_{r9}$ are commonly connected at the drain terminals to form an output terminal $O_3$ of the offset compensating circuit 3. The output terminal $O_3$ is connected through an n-channel MOS transistor $T_{r10}$ as a load to the second potential supply terminal 7. The gate of the transistor $T_{r7}$ is connected to the drain terminal of the transistor $T_{r1}$. The gate of the transistor $T_{r8}$ is connected to the second input terminal $IN_2$ of the differential amplifier and the gate of the transistor $T_{r4}$. The gate of the transistor $T_{r9}$ is connected to the first input terminal $IN_1$. The output terminal $O_3$ is connected to the gates of the transistors $T_{r5}$, $T_{r6}$ and $T_{r10}$.

In the circuit threshold voltage matching circuit 4, between the first and second potential supply terminals 6 and 7 are connected a load MOS transistor $T_{r11}$ of P-channel type and a drive MOS transistor $T_{r12}$ of n-channel type in series. The drain terminal of the transistor $T_{r11}$, i.e. the output terminal $O_4$ of the matching circuit, is connected to the gate of the transistor $T_{r11}$. The gate of the transistor $T_{r12}$ is connected to the first output terminal $O_1$ of the differential amplifier circuit 2.

In the linear amplifier circuit 5, a load MOS transistor $T_{r13}$ of p-channel and a drive MOS transistor $T_{r14}$ of n-channel are connected in series between the first and second potential supply terminals 6 and 7, the gate of the transistor $T_{r13}$ is connected to the output terminal $O_4$ of the threshold voltage matching circuit 4. The drain of the transistor $T_{r13}$, i.e. the output terminal $O_5$ of the linear amplifier circuit, is connected to the output terminal 10 of the operational amplifier. The gate of the transistor $T_{r14}$ is connected to the second output terminal $O_2$ of the differential amplifier circuit 2.

In operation, the constant current source transistor $T_{r2}$, which is supplied with a DC bias from the constant current source circuit 1, operates in the saturation region. The first input terminal $IN_1$ is supplied with a DC voltage at a fixed level. The second input terminal $IN_2$ is supplied with a DC voltage at a fixed level having an AC signal superposed thereon. To the gates of the load transistors $T_{r5}$ and $T_{r6}$ is applied the output $O_3$ of the offset compensating circuit 3 as a bias voltage. In the foregoing description, characters $IN_1$, $IN_2$, $O_1$ to $O_5$ were used to designate the terminals but will be used to also designate the signals appearing at the corresponding terminals. So long as the transistor $T_{r2}$ operates in the saturation region, the drain current of the transistor $T_{r2}$ is kept at a fixed level. The drain current of the transistor $T_{r7}$ is kept constant in the operation of the transistor $T_{r7}$ within the saturation region. However, if the DC voltage levels at the input terminals $IN_1$ and $IN_2$ are varied, the DC levels of the outputs $O_1$ and $O_2$ are caused to be varied. In this case, the drain current of the transistor $T_{r7}$ is also varied at the same time to change the DC level at the output terminal $O_3$. Owing to this change of the DC level at terminal $O_3$ the DC levels at the output terminals $O_1$ and $O_2$ are maintained to constant levels, respectively.

When the DC voltage levels at the first and second input terminals $IN_1$ and $IN_2$ become both high, the constant current source transistor $T_{r2}$ of the differential amplifier circuit 2 shifts in operation to the non-saturation region so that the drain current of the transistor $T_{r2}$ decreases. As a result, the DC voltage levels at the first and second output terminals $O_1$ and $O_2$ of the differential amplifier circuit 2 become lower. Therefore, it is necessary to prevent such changes of the DC voltage levels at the output terminals $O_1$ and $O_2$ attributed to a change (the offset voltage) of the DC voltages at the input terminals $IN_1$ and $IN_2$. To this end, the offset compensating circuit 3 is so designed as to have the following functions. When the drain current of the constant current source transistor $T_{r2}$ of the diferential amplifier circuit 2 decreases as stated above, the gate voltages at the transistors $T_{r5}$ and $T_{r6}$ are decreased by the amount corresponding to the reduction of the drain current. In this way, the DC voltage levels at the output terminals $O_1$ and $O_2$ may be held constant irrespective of the change of the DC voltage levels at the input terminals $IN_1$ and $IN_2$.

In order that the offset compensating circuit 3 has the above-mentioned function, the W/L ratios ($g_m$ ratio or conductance ratio) among the transistors constituting the differential amplifier circuit 2 and the offset compensating circuit 3 are so selected as to satisfy the following equations (1) and (2).

$$g_{m3}=g_{m4}, g_{m5}=g_{m6}, g_{m8}=g_{m9} \quad (1)$$

$$g_{m2} \cdot g_{m3} \cdot g_{m5} = g_{m7} \cdot g_{m8} \cdot g_{m10}/2 \quad (2)$$

where $g_{m2}$ to $g_{m10}$ are the conductances of the transistors $T_{r2}$ to $T_{r10}$, respectively. In the W/L ratio, W designates the channel width of the MOS transistor and L is a channel length of the same.

The $g_m$ ratios are so selected that the $g_m$ ratios between transistors $T_{r2}$ and $T_{r7}$, the $g_m$ ratio between transistors $T_{r3}$ and $T_{r8}$, and the $g_m$ ratio of $T_{r10}$ to the sum of the conductances of $T_{r5}$ and $T_{r6}$ are all equal. With such a selection of the $g_m$ ratios, the drain current of the constant current source transistor $T_{r7}$ in the offset compensating circuit 3 decreases at the same rate as the drain current of the transistor $T_{r2}$ in the differential amplifier circuit decreases. Accordingly, the drain current of the load transistor $T_{r10}$ also decreases by the amount of the decrease. In this manner, the DC voltage levels at the output terminals $O_1$ and $O_2$ in the differential amplifier circuit 2 are held at a fixed value irrespective of the change of the DC voltage levels at the input terminals $IN_1$ and $IN_2$.

The circuit threshold voltage matching circuit 4 stabilizes the DC voltage level at the output terminal 10 of the operational amplifier. To this end, the circuit 4 operates to eliminate a deviation between the circuit threshold voltage of the linear amplifier circuit 5 and the output voltage of the differential amplifier circuit 2, irrespective of the DC voltage levels at the output terminals $O_1$ and $O_2$. In operation, when the DC voltage levels at the output terminals $O_1$ and $O_2$ drop, the DC voltage level at the output terminal $O_4$ of the threshold voltage matching circuit 4 increases. Since the output at terminal $O_4$ is applied as a bias voltage to the gate of the transistor $T_{r13}$, the DC voltage at the output terminal 10 of the operational amplifier is held at a fixed level even if the DC voltage levels at the output terminals $O_1$ and $O_2$ change. In this case, the $g_m$ ratio between the transistors $T_{r11}$ and $T_{r14}$ must to be selected so as to satisfy the following equation (3).

$$G_{m11} \cdot g_{m12} = g_{m13} \cdot g_{m14} \quad (3)$$

where $g_{m11}$ to $g_{m14}$ are the conductances of the transistors $T_{r11}$ to $T_{r14}$, respectively. In other words, the $g_m$ ratio of the transistors $T_{r11}$ and $T_{r13}$ must be equal to the $g_m$ ratio of the drive transistors $T_{r12}$ and $T_{r14}$. In this case, a condition must be satisfied in which the DC voltage level at the first output terminal $O_1$ is equal to that at the second output terminal $O_2$. This condition, however, is satisfied as long as the symmetrical construction of the differential amplifier is sustained, since the outputs $O_1$ and $O_2$ are those from the differential amplifier 2. Thus, the DC voltage level at the output terminal 10 can be kept at a fixed value irrespective of the DC voltage levels at the first and second input terminals $IN_1$ and $IN_2$ of the operational amplifier.

As described above, the operational amplifier as shown in FIG. 1 can not only keep constant the DC voltage level at the output terminal 10 but also solve the problem of thermal runaway. Additionally, the input bias current may be made considerably small and the circuit construction of the operational amplifier is well adapted for integrated circuit fabrication. Further, use of the complementary MOS transistors is acceptable in the circuit construction of the operational amplifier. If such type transistors are used, the operational amplifier is operable at a low voltage for example, about 5 V. Since the operational amplifier is comprised of two stage amplifiers, the differential amplifier and the linear amplifier circuit, there is no possibility of the oscillation due to a phase lag of the output signal from the operational amplifier with respect to the input signals thereof. Such an oscillation takes place when that phase lag is 180° and the gain is 1 or more. Since the maximum phase delay of one stage of the amplifier is 90°, two stage amplifiers can not satisfy the oscillation condition.

Figure 2:
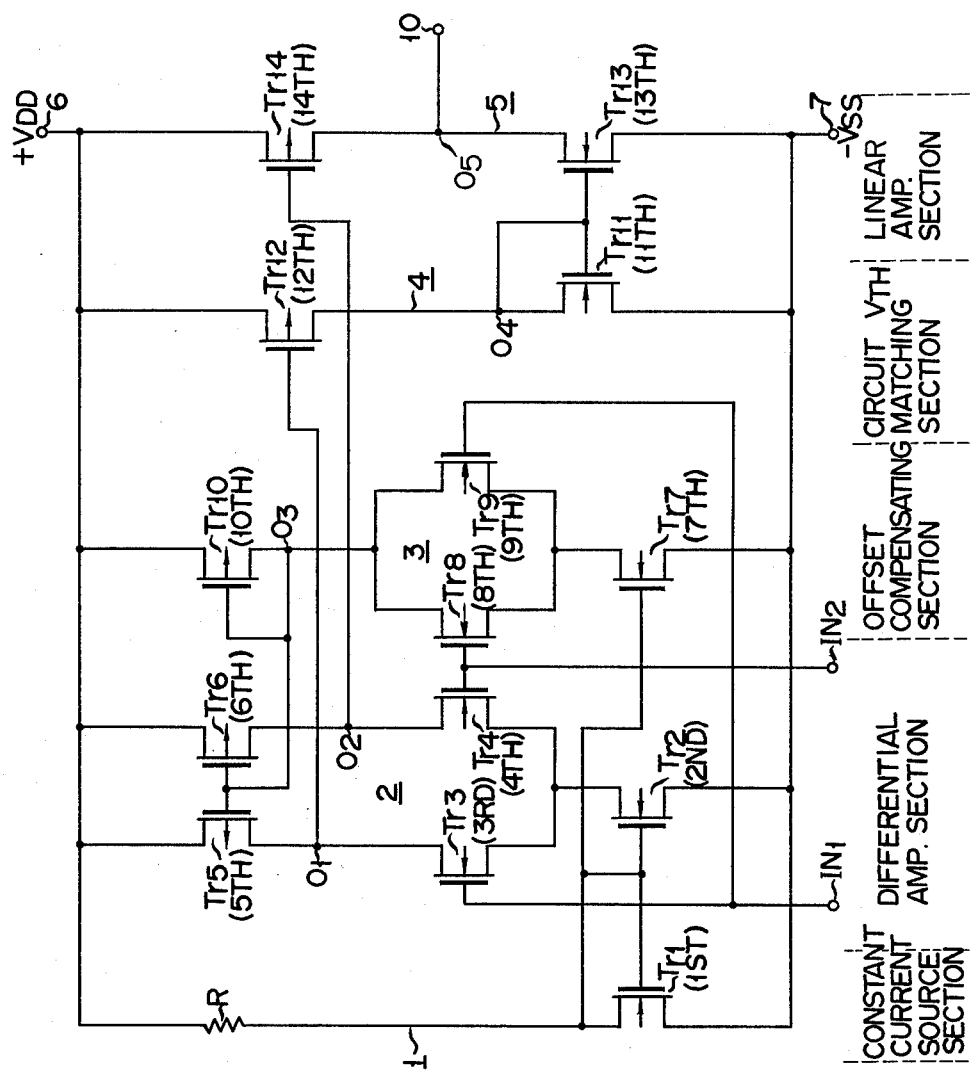
FIG. 2 shows a circuit diagram of a second embodiment of an operational amplifier circuit in which some of MOS transistors in FIG. 1 are replaced by MOS transistors with a different channel type.

Turning now to FIG. 2, there is shown a second embodiment of the operational amplifier according to the invention. In this example, the transistors used are different from those in FIG. 1 in channel type. The operation and the effects of this example are much the same as those of the FIG. 1 circuit. Accordingly, like numerals are used to designate like MOS transistors, and further explanation of the example will be omitted here. The transistors shown in FIG. 2 operate at operative regions different from those of the transistors shown in FIG. 1. Therefore, the circuits shown in FIG. 1 and FIG. 2 may be used for applications different from each other.

Figure 3:
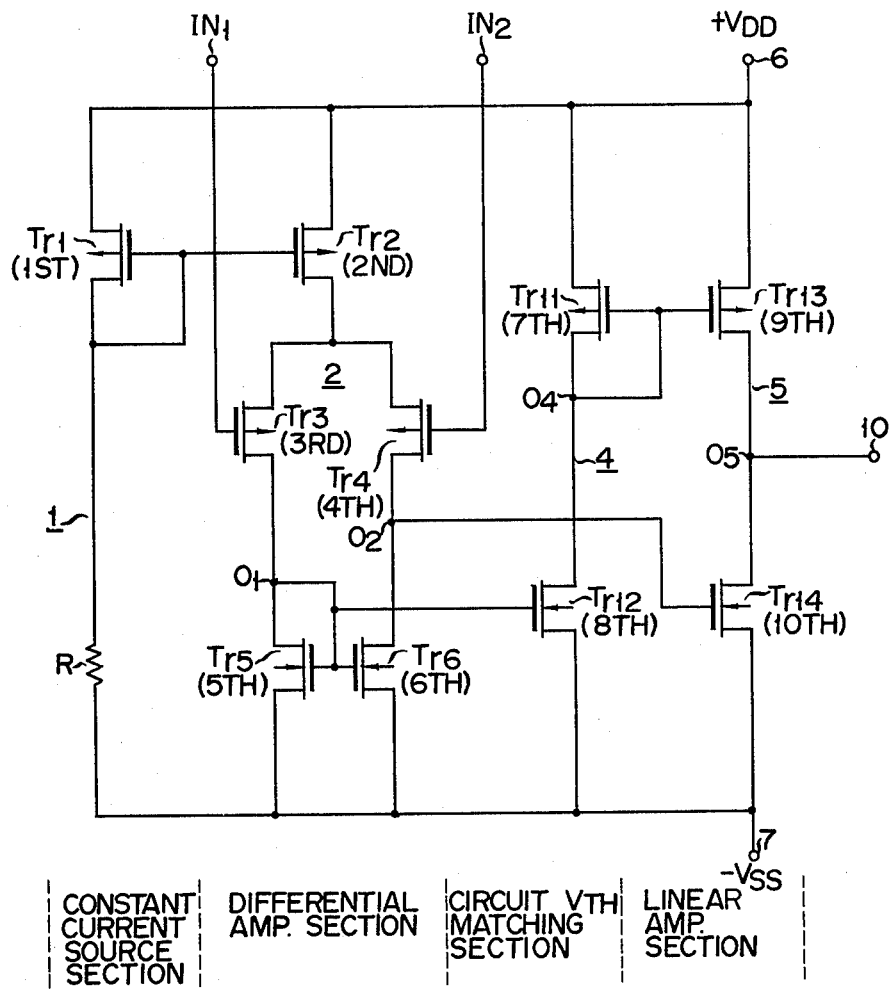
FIG. 3 shows a circuit diagram of an operational amplifier which is a third embodiment according to the invention, with a circuit threshold voltage matching circuit used as a stabilizing circuit.

A third embodiment shown in FIG. 3 corresponds to the circuit shown in FIG. 1 without the offset compensating circuit 3. In this embodiment, the output $O_5$ of the linear amplifier circuit 5 is stabilized only by a circuit threshold voltage matching circuit 4. In this example, a mirror circuit is used in which the gate and the drain of the load transistors $T_{r5}$ and $T_{r6}$ in the differential amplifier are connected to each other and the potential at the connection point is applied to the gate of the load transistor $T_{r6}$. The provision of the mirror circuit improves the voltage gain of the differential amplifier circuit 2 by approximately 10 dB, compared to the FIG. 1 circuit. Since the operation and the effect of the circuit threshold voltage matching circuit 4 are the same as those of the circuit 4 in FIG. 1, no explanation will be given here.

Figure 4:
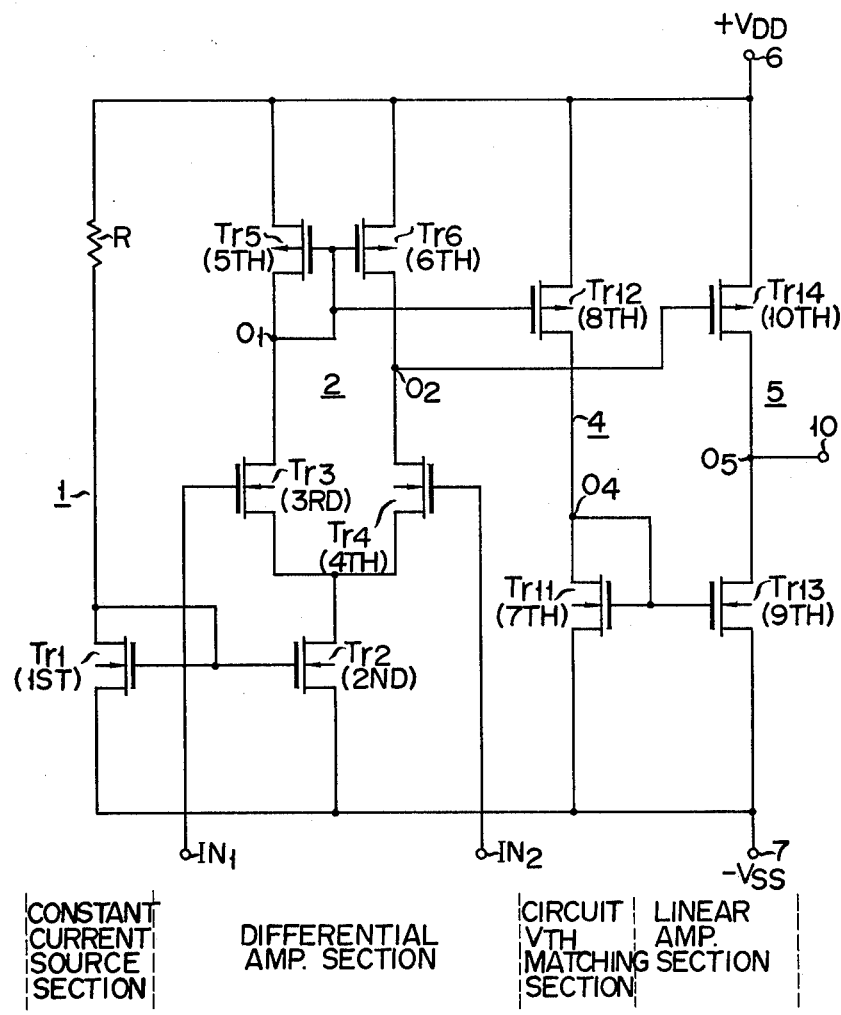
FIG. 4 shows a circuit diagram of a fourth embodiment of an operational amplifier according to the invention,, in which some of the MOS transistors in FIG. 3 are replaced by MOS transistors with a different channel type.

In the fourth embodiment shown in FIG. 4, MOS transistors used are different in channel type from those in FIG. 3. In the figure, the same numerals are applied to the corresponding transistors in the circuit of FIG. 3. The transistors used in FIG. 3 and FIG. 4 are different from each other in operative regions. Therefore, the circuits shown in FIG. 3 and FIG. 4 may be used for applications different from each other.

Figure 5:
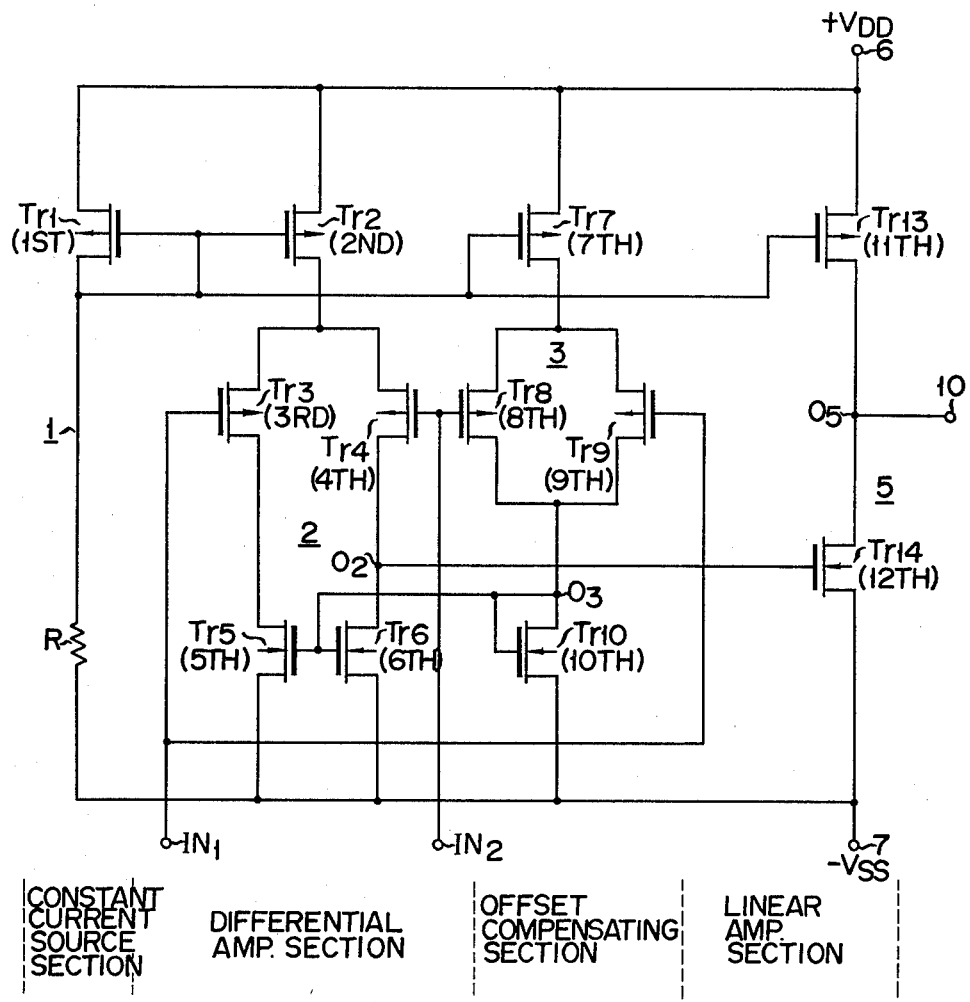
FIG. 5 shows a circuit diagram of a fifth embodiment of an operational amplifier according to the invention, in which a stabilizing circuit includes an offset compensating circuit.

The fifth embodiment shown in FIG. 5 corresponds to the circuit in FIG. 1 with omission of the circuit threshold voltage matching circuit 4. In the fifth embodiment, the output $O_5$ of the linear amplifier circuit 5 is stabilized only by an offset compensating circuit 3. This embodiment may be sufficiently applicable for some purpose. In this figure, the bias voltage to the gate of the load transistor $T_{r13}$ in the linear amplifier circuit 5 is supplied from the drain terminal of the transistor $T_{r1}$ in the constant current source circuit 1. When comparing with the embodiments shown in FIGS. 1 and 3, the fifth embodiment is hard to match the circuit threshold voltage of the differential amplifier circuit 2 to that of the linear amplifier circuit 5. For this, there is a possibility that the offset voltage increases due to the change of the input voltages at the input terminals $IN_1$ and $IN_2$. However, this embodiment is simple in circuit construction and the output $O_5$ is stabilized to some extent. Thus the embodiment is sufficiently applicable for some special purposes.

Figure 6:
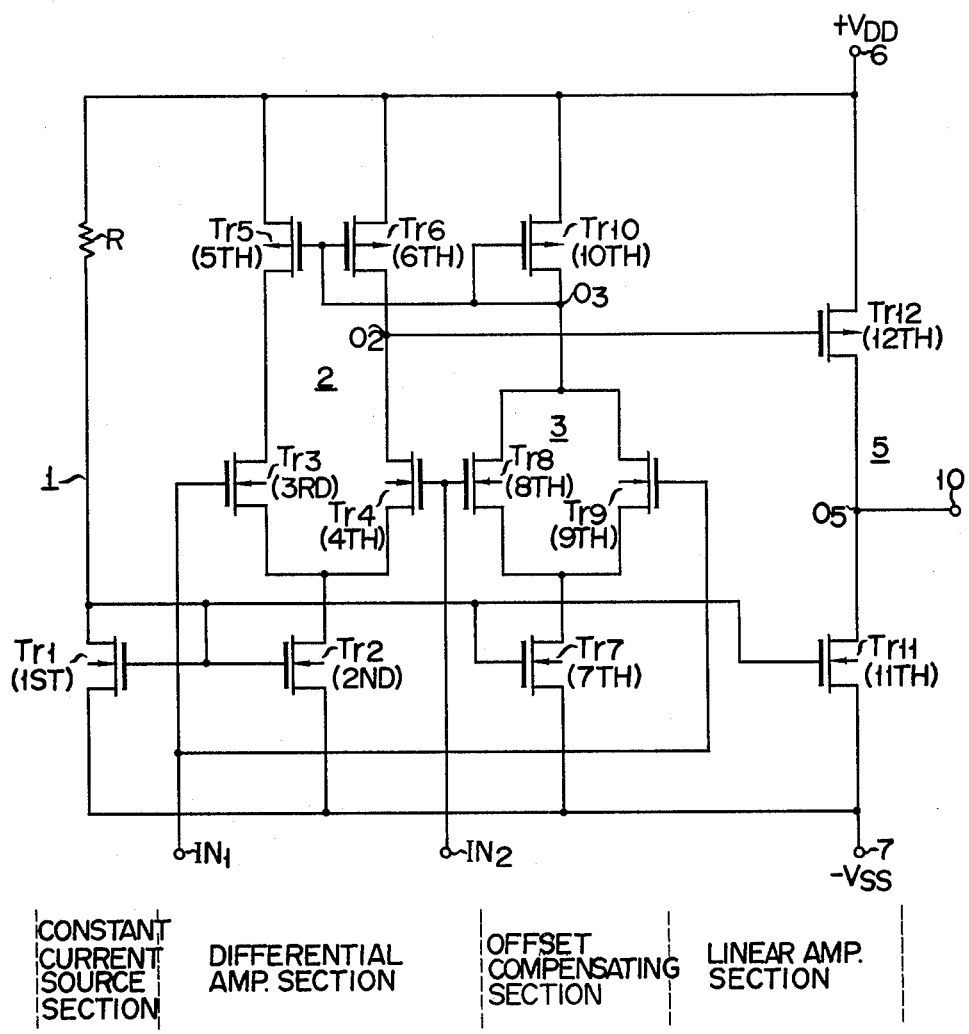
FIG. 6 shows a circuit diagram of a sixth embodiment of an operational amplifier according to the invention, in which some of the MOS transistors in FIG. 5 are replaced by MOS transistors with a different channel type.

A sixth embodiment shown in FIG. 6 employs the MOS transistors of which the channel type is different from that of the MOS transistors shown in FIG. 5. The same symbols as those in FIG. 5 designate the corresponding transistors in FIG. 6. The MOS transistors in FIGS. 5 and 6 are different from each other in operative regions. Therefore, the circuits in FIGS. 5 and 6 may be used for purpose different from each other.

A seventh embodiment shown in FIG. 7 is so designed that the circuit threshold voltage Vth of the linear amplifier 5 is made comparable to the DC voltage level of the differential amplifier output. In short, the seventh embodiment realizes the stability of the output voltage of the operational amplifier against the variation of the inputs thereof, in such a way that the circuit Vth of the linear amplifier circuit 5 follows the output DC level of the differential amplifier circuit 5.

In the seventh embodiment, the second output $O_2$ of the differential amplifier 2 with the inputs $IN_1$ and $IN_2$ is amplified in the linear amplifier circuit 5. The output $O_8$ of the linear amplifier circuit 5 is derived through a buffer circuit 6 to the output terminal 10 of the operational amplifier circuit. A circuit 4 for compensating the circuit threshold voltage Vth (also referred to as a threshold voltage matching circuit) of the linear amplifier circuit 5 serves as a linear amplifier circuit for amplifying the inputs $IN_1$ and $IN_2$. The output $O_6$ of the circuit 4 adjusts the circuit threshold voltage Vth of the linear amplifier circuit 5 to secure a fixed gain operation of the operational amplifier irrespective of the variation of the inputs $IN_1$ and $IN_2$.

All the transistors used in the FIG. 7 example are of enhancement type and hence may be fabricated on a single substrate by the integrated circuit technology. A constant current source circuit 1 is comprised of a p-channel MOS transistor $T_{r21}$ and an n-channel MOS transistor $T_{r22}$, which operate in the saturation region, connected in series between the first and second potential supply terminals 6 ($+V_{DD}$) and 7 ($-V_{ss}$). The gate of the transistor $T_{r22}$ is connected to the first potential supply terminal 6 and the gate of the transistor $T_{r21}$ is connected to the drain terminal of the same. A constant voltage is derived from the drain terminal.

In the differential amplifier 2, between the first and second potential supply terminals 6 and 7 is connected a series path including a p-channel MOS transistor $T_{r23}$ for a constant current supply, a p-channel MOS transistor $T_{r24}$, an n-channel MOS transistor $T_{r26}$, and a load MOS transistor $T_{r28}$ of n-channel. Another series path, including a p-channel MOS transistor $T_{r25}$, and n-channel load MOS transistors $T_{r27}$ and $T_{r29}$, branches off from the drain terminal of the transistor $T_{r23}$ and terminates into the second potential supply terminal 7. The gate of the transistor $T_{r23}$ is continuous to the drain terminal of the transistor $T_{r23}$. Continuity also exists between the gate of the transistor $T_{r24}$ and the first input terminal $IN_1$ and between the gate of the transistor $T_{r25}$ and the second input terminal $IN_2$. The gates of the transistors $T_{r26}$ to $T_{r29}$ are commonly connected to the drain terminal of the transistor $T_{r24}$, i.e. to the first output terminal $O_1$ of the differential amplifier circuit.

In the circuit Vth compensating circuit 4 (or the threshold voltage matching circuit) for the linear amplifier circuit 5, a series path intervening between the first potential supply terminal 6 and the second potential supply terminal 7, includes a p-channel MOS transistor $T_{r30}$ for constant current supply, parallel coupled MOS transistors $T_{r31}$ and $T_{r32}$ of the n-channel type, and a load MOS transistor $T_{r33}$ of the n-channel type which operates at saturation region. A continuous path is formed between the gate of the transistor $T_{r30}$ and the drain terminal of the transistor $T_{r21}$, the gate of the transistor $T_{r31}$ and the second input terminal $IN_2$, the gate of the transistor $T_{r32}$ and the first input terminal $IN_1$, the substrates of the transistors $T_{r31}$ and $T_{r32}$ and the source terminals of them, and the gate of the transistor $t_{r33}$ and the first output terminal $O_1$ of the differential amplifier circuit 2.

The linear amplifier circuit 5 is comprised of a first stage amplifier circuit $5_1$ and a second amplifier circuit $5_2$. In the amplifier circuit $5_1$, a p-channel MOS transistor $T_{r35}$ for signal amplifying and a MOS transistor $T_{r34}$ for constant current supply are connected in series between the first potential supply terminal 6 and the output terminal $O_7$ of the circuit $5_1$. An n-channel load MOS transistor $T_{r37}$ and another n-channel MOS transistor $T_{r36}$ for signal amplifying are connected in series between the second potential supply terminal 7 and the output terminal $O_7$. The gate of the transistor $T_{r34}$ is connected to the drain of the transistor $T_{r21}$. The gates of the transistors $T_{r35}$ and $T_{r36}$ are commonly coupled with the second output terminal $O_2$ of the differential amplifier circuit 2. The gate of the transistor $T_{r37}$ is coupled with the output terminal $O_6$ of the circuit Vth matching circuit 4. In the circuit $5_2$, a series circuit provided between the first potential supply terminal 6 and the output terminal $O_8$ of the circuit $5_2$ includes a p-channel MOS transistor $T_{r38}$ for constant current supply and a p-channel MOS transistor $T_{r39}$. Another series circuit including an n-channel load MOS transistor $T_{r41}$ and another amplifying MOS transistor $T_{r40}$ of n-channel, is inserted between the second potential supply terminal 7 and the output terminal $O_8$ of the circuit $5_2$. The gates of the transistors $T_{r38}$ and $T_{r34}$ are common in connection and the gates of the transistors $T_{r39}$ and $T_{r40}$ are connected to the output terminal $O_7$ of the circuit $5_1$. The gate of the transistor $T_{r41}$ is connected to the output terminal $O_6$ of the Vth matching circuit 4.

In the buffer circuit 6, connected in series between the first potential supply terminal 6 and the second potential supply terminal 7 are a p-channel MOS transistor $T_{r42}$, and an n-channel MOS transistor $T_{r43}$. The transistors $T_{r42}$ and $T_{r43}$ are connected at the gates to the output terminal $O_8$ of the linear amplifier circuit $5_2$ and the drain terminals to the output terminal $O_9$ of the buffer circuit 6 leading to the output terminal 10 of the operational amplifier.

In the differential amplifier circuit 2, the conductance $g_m$ of each transistor $T_{r24}$ and $T_{r25}$ at the input stage is large and the conductance $g_m$ of each load transistor $T_{r26}$ and $T_{r29}$ is small for the purpose of increasing the gain of the differential amplifier circuit. Further, the common mode rejection ratio (CMRR) of the differential amplifier is improved by applying the drain potential of the transistor $T_{r26}$ to the gates of the transistors $T_{r26}$ and $T_{r29}$. In the differential amplifier circuit 2, when the DC voltage levels at the input terminals IN$_1$ and IN$_2$ are equal to each other, if these input DC levels rise together, the transistors $T_{r24}$ and $T_{r25}$ approach the cut off point. For this, the drain potential of the transistor $T_{r26}$ drops. Thus, the transistors $T_{r26}$ to $T_{r29}$ approach the cut-off state so that the drain potential (the potential at the second output $O_2$) is kept substantially constant.

The operation of the circuit 4 for compensating the circuit threshold voltage Vth will be described. The DC voltage at the second input terminal IN$_2$ is used as a reference voltage level. It is assumed that the DC voltage levels at the input terminals IN$_1$ and IN$_2$ are equal each other. Under this condition, if the DC voltage at the second input terminal IN$_2$ rises, the the second output $O_2$ of the differential amplifier 2 drops. Accordingly, the DC bias level $O_2$ to the circuit $5_1$ of the linear amplifier circuit 5 reduces. For this, the circuit $5_1$ operates in the region where the maximum gain is obtained. More specifically, when the DC voltage level at the second input terminal IN$_2$ rises (the DC voltage levels of the first and second inputs being equal), the drain potential of the transistor $T_{r33}$ rises by an amount corresponding to the increase of the second input voltage level. This means that the ON resistance of the transistor $T_{r37}$ reduces, that is to say, the conductance $g_m$ thereof increases. Therefore, in such a situation, the circuit Vth of the circuit 5 drops. At this time, the transistors $T_{r24}$ and $T_{r25}$ operate in the vicinity of the cut-off point so that the input bias voltage $O_2$ to the circuit $5_1$ also decreases. Accordingly, the circuit $5_1$ can amplify the input $O_2$ at the maximum gain. The post stage linear amplifier circuit $5_2$ is similarly controlled and thus amplifies the output $O_7$ of the circuit $5_1$ at the maximum gain.

The buffer circuit 6 is used to decrease the output impedance and receives the output $O_8$ of the circuit $5_2$ to produce the output $O_9$. The buffer satisfactorily operates with 1 or more voltage gain.

The transistor $T_{r21}$ used in the constant current source circuit 1 applies the drain potential with a fixed level to the gates of the transistors $T_{r23}$, $T_{r30}$, $T_{r34}$ and $T_{r38}$ whereby the currents flowing through these transistors are kept substantially constant irrespective of a change of the threshold voltages of the transistors. In this way, the variation of the threshold voltages $V_{th}$ of these transistors is corrected.

The eighth embodiment shown in FIG. 8 uses the p-channel MOS transistors $T_{r31}$ and $T_{r32}$ in place of the n-channel MOS transistors $T_{r31}$ and $T_{r32}$ in FIG. 7. The corresponding transistors are all designated by the like reference numerals. The minor alternation just mentioned replaces the transistors $T_{r36}$ and $T_{r37}$ by the transistors $T_{r40}$ and $T_{r41}$. The outputs $O_7$ and $O_8$ of the linear amplifier circuits $5_1$ and $5_2$ are taken from the sources of the transistors $T_{r37}$ and $T_{r41}$, respectively. The same effects as those of the circuit in FIG. 7 are expected in this example. No further elaboration will be given.

What we claim is:

1. An operational amplifier comprising:
   a constant current source circuit;
   a differential amplifier circuit which is constructed by using MOS (metal oxide semiconducter) transistors, connected between a first potential supply terminal and a second potential supply terminal, coupled to said constant current source circuit and supplied with first and second inputs;
   a linear amplifier circuit which is constructed by using MOS transistors, connected between said first and second potential supply terminals, and receives the output of said differential amplifier circuit to produce an output corresponding to said output received; and
   an offset compensating circuit which is connected between said first and second potential supply terminals, and to said differential amplifier circuit, for keeping the output DC level of said differential amplifier circuit substantially constant in response to change of the DC voltage levels of said first and second inputs of said differential amplifier circuit.

2. An operational amplifier according to claim 1, in which said constant current source circuit includes a first p-channel MOS transistor which is connected at the source terminal to said first potential supply terminal and at the drain terminal to the gate of the same transistor;
   said differential amplifier circuit comprises a second p-channel MOS transistor for constant current supply which is connected at the source terminal to said first potential supply terminal and at the gate to the drain terminal of said first MOS transistor, a third amplifying p-channel MOS transistor which is connected at the source terminal to the drain terminal of said second MOS transistor and at the gate to said first input, a fourth amplifier p-channel MOS transistor which is connected at the source terminal to the drain terminal of said second MOS transistor and at the gate to said second input, a fifth load n-channel MOS transistor which is connected between the drain terminal of said third transistor and said second potential supply, and a sixth load n-channel MOS transistor which is connected between the drain terminal of said fourth transistor and said second potential supply terminal and at the gate to the gate of said fifth transistor; and
   said offset compensating circuit is comprised of a seventh p-channel MOS transistor for constant current supply which is connected at the source terminal to said first potential supply terminal and at the gate to the drain of said first MOS transistor, an eighth amplifying p-channel MOS transistor which is connected at the source to the drain of said seventh transistor, at the gate to said second input, and at the drain to the output terminal of said offset compensating circuit, a ninth amplifier p-channel MOS transistor which is connected at the source to the drain of said seventh transistor, and at the drain to said output terminal and at the gate to said first input, and a tenth load n-channel MOS transistor which is connected between said second potential supply terminal and said output terminal of said offset compensating circuit, and at the gate to said output terminal and the gates of said fifth and sixth MOS transistors; and said linear amplifier circuit is comprised of a 11th load p-channel MOS transistor which is connected between said first potential supply terminal and the output terminal of said linear amplifier circuit and at the gate to the drain of said first MOS transistor, and a 12th drive n-channel MOS transistor which is connected between said output terminal of said linear amplifier circuit and said second potential supply terminal and at the gate to the output terminal of said differential amplifier circuit.

3. An operational amplifier according to claim 1, in which said constant current source circuit includes a first n-channel MOS transistor which is connected at the source terminal to said second potential supply terminal and at the drain terminal to the gate of the same transistor;

said differential amplifier circuit comprises a second n-channel MOS transistor for constant current supply which is connected at the source terminal to said second potential supply terminal and at the gate to the drain terminal of said first MOS transistor, a third amplifying n-channel MOS transistor which is connected at the source terminal to the drain terminal of said second MOS transistor and at the gate to said first input, a fourth amplifying n-channel MOS transistor which is connected at the source terminal to the drain terminal of said second MOS transistor and at the gate to said second input, a fifth load p-channel MOS transistor which is connected between the drain terminal of said third transistor and said first potential supply terminal, and a sixth load p-channel MOS transistor which is connected between the drain terminal of said fourth transistor and said first potential supply terminal and at the gate to the gate of said fifth transistor;

said offset compensating circuit is comprised of a seventh n-channel MOS transistor for constant current supply which is connected at the source terminal to said second potential supply terminal and at the gate to the drain of said first MOS transistor, an eighth amplifier n-channel MOS transistor which is connected at the source to the drain of said seventh transistor, at the gate to said second input, and at the drain to the output terminal of said offset compensating circuit, a ninth amplifying n-channel MOS transistor which is connected at the source to the drain of said seventh transistor, and at the drain to said output terminal and at the gate to said first input, and a tenth load p-channel MOS transistor which is connected between said first potential supply terminal and said output terminal, and at the gate to said output terminal and the gates of said fifth and sixth MOS transistors; and said linear amplifier circuit is comprised of a 11th load n-channel MOS transistor which is connected between said second potential supply terminal and the output terminal of said linear amplifier circuit and at the gate to the drain of said first MOS transistor, and a 12th drive p-channel MOS transistor which is connected between said output terminal and said first potential supply terminal and at the gate to the output terminal of said differential amplifier circuit.

4. An operational amplifier comprising:

a constant current source circuit;

a differential amplifier circuit which is constructed by using MOS (metal oxide semiconductor) transistors, connected between a first potential supply terminal and a second potential supply terminal, coupled to said constant current source circuit and supplied with first and second inputs;

a linear amplifier circuit which is constructed by using MOS transistors, connected between said first and second potential supply terminals, and receives the output of said differential amplifier circuit to produce an output;

an offset compensating circuit which is connected to said first and second potential supply terminals and said differential amplifier, for keeping substantially constant the output DC level of said differential amplifier circuit in response to change of the first and second input DC levels of said differential amplifier; and a circuit threshold voltage compensating circuit which is connected to said first and second potential supply terminals, said differential amplifier circuit and said linear amplifier circuit for stabilizing the output of said linear amplifier circuit in accordance with the output level of said differential amplifier circuit.

5. An operational amplifier comprising:

a constant current source circuit;

a differential amplifier circuit which is constructed by using MOS (metal oxide semiconductor) transistors, connected between a first potential supply terminal and a second potential supply terminal, coupled to said constant source circuit and supplied with first and second inputs to produce a first and second output;

a linear amplifier circuit constructed by using MOS transistors, connected between said first and second potential supply terminals and receiving said second output of said differential amplifier circuit to produce an output corresponding to said second output received;

a stabilizing circuit connected to said first and second potential terminals, said differential amplifier circuit and said linear amplifier circuit, for stabilizing the output of said linear amplifier circuit, said stabilizing circuit including a load p-channel MOS transistor which has a source-drain path connected between said first potential terminal and the output terminal of said stabilizing circuit and has a gate terminal coupled to said output terminal of said stabilizing circuit, and a drive n-channel MOS transistor which has a source-drain path connected between the output terminal of said stabilizing circuit and said second potential supply terminal and has a gate terminal coupled to said first output of said differential amplifier circuit; and said linear amplifier circuit comprising a load p-channel MOS transistor which has a source-drain path connected between said first potential supply terminal and the output terminal of said linear amplifier circuit and has a gate terminal coupled to the output of said stabilizing circuit, and a drive n-channel MOS transistor which has a source-drain path connected between said second potential supply terminal and the output of said linear amplifier circuit and has a gate terminal coupled to said second output of said differential amplifier circuit.

6. An operational amplifier comprising:
a constant current source circuit;
a differential amplifier circuit which is constructed by using MOS (metal oxide semiconductor) transistors, connected between a first potential supply terminal and a second potential supply terminal, coupled to said constant source circuit and supplied with first and second inputs to produce a first and a second output;
a linear amplifier circuit constructed by using MOS transistors, connected between said first and second potential supply terminals and receiving said second output of said differential amplifier circuit to produce an output corresponding to said second output received;
a stabilizing circuit connected to said first and second potential terminals, said differential amplifier circuit and said linear amplifier circuit, for stabilizing the output of said linear amplifier circuit, said stabilizing circuit including a load n-channel MOS transistor having a source-drain path connected between said second potential supply terminal and the output terminal of said stabilizing circuit and has a gate terminal coupled to said output terminal of said stabilizing circuit, and a drive p-channel MOS transistor which has a source-drain path connected between the output terminal of said stabilizing circuit and said first potential supply terminal and has a gate terminal coupled to said first output of said differential amplifier circuit; and
said linear amplifier circuit comprising a load n-channel MOS transistor having a source-drain path connected between said second potential supply terminal and the output terminal of said linear amplifier circuit and has a gate terminal coupled to the output of said stabilizing circuit, and a drive p-channel MOS transistor which has a source-drain path coupled between said first potential supply terminal and the output of said linear amplifier circuit and has a gate terminal coupled to said second output of said differential amplifier circuit.

7. An operational amplifier comprising:
a constant current source circuit;
a differential amplifier circuit constructed by using MOS (metal oxide semiconductor) transistors, connected between a first potential supply terminal and a second potential supply terminal, coupled to said constant current source circuit and supplied with first and second inputs;
a linear amplifier circuit constructed by using MOS transistors, connected between said first and second potential supply terminals and receiving said output of said differential amplifier circuit to produce an output corresponding to said output received;
a circuit threshold voltage compensating circuit connected to said first and second potential supply terminals, said differential amplifier circuit and said linear amplifier circuit, for stabilizing the output of said linear amplifier circuit;

said constant current source circuit including a first p-channel MOS transistor having a source-drain path connected between said first and second potential supply terminals and having a gate coupled to the drain of said first transistor;
said differential amplifier circuit comprising a third p-channel MOS transistor for constant current supply connected at the source to said first potential supply terminal and at the gate to the drain terminal of said first transistor, a fourth amplifying p-channel MOS transistor connected at the source to the drain of said third transistor and at the gate to said first input, a fifth amplifying n-channel MOS transistor connected at the source to the drain of said third transistor, and at the gate to said second input, sixth and eighth n-channel load MOS transistors connected in series between the drain terminal of said fourth transistor and said second potential supply terminal, and seventh and ninth load n-channel MOS transistors connected in series between the drain terminal of said fifth transistor and said second potential supply terminal, the gates of said sixth to ninth transistors being connected commonly to a first output terminal of said differential amplifier;
said circuit threshold voltage matching circuit being comprised of a tenth p-channel MOS transistor for constant current supply connected at the source to said first potential supply terminal and at the gate to the drain terminal of said first transistor, an eleventh n-channel MOS transistor connected between the drain of said tenth transistor and the output terminal of said matching circuit and at the gate to said second input, and at the drain terminal to the output terminal of said matching circuit, a twelfth n-channel MOS transistor connected between the drain of said tenth transistor and said output terminal, at the gate to said first input, and at the drain terminal to the output terminal of said matching circuit, and a thirteenth load n-channel MOS transistor connected between said output terminal and said second potential supply terminal, and at the gate to the first output terminal of said operational amplifier circuit; and
said linear amplifier circuit comprising first and second amplifier circuits in which said first amplifier has a fourteenth p-channel MOS transistor for constant current supply connected at the source to said first potential supply terminal and at the gate to the drain of said first transistor, a fifteenth amplifying p-channel transistor connected between the drain of said fourteenth transistor and the output terminal of said first amplifier circuit, and at the gate to the second output terminal of said differential amplifier, a sixteenth amplifier n-channel MOS transistor connected at the drain to the output terminal of said first amplifier circuit and at the gate to a second output terminal of said differential amplifier circuit, and a seventeenth MOS transistor connected between the source of said sixteenth transistor and said second potential supply terminal, and at the gate to the output of said matching circuit, and said second amplifier circuit having an eighteenth p-channel MOS transistor for constant current supply connected at the source to said first potential supply terminal and at the gate to the drain of said first transistor, a nineteenth amplifying MOS transistor connected between the drain of said eighteenth transistor and the output terminal of said second amplifier circuit and at the gate to the output of said first amplifier circuit, a twentieth amplifier MOS transistor connected at the drain to the output terminal of said second amplifier circuit and at the gate to the output of said first amplifier circuit, and a twenty-first load n-channel MOS transistor connected between the source of said twentieth transistor and said second potential supply terminal and at the gate to the output of said matching circuit.

8. An operational amplifier comprising:

a constant current source circuit;

a differential amplifier circuit constructed by using MOS (metal oxide semiconductor) transistors, connected between a first potential supply terminal and a second potential supply terminal, coupled to said constant current source circuit and supplied with first and second inputs;

a linear amplifier circuit constructed by using MOS transistors, connected between said first and second potential supply terminals and receiving the output of said differential amplifier circuit to produce an output corresponding to said output received;

a circuit threshold voltage compensating circuit connected to said first and second potential supply terminals, said differential amplifier circuit and said linear amplifier circuit, for stabilizing the output of said linear amplifier circuit;

said constant current source circuit including a first p-channel MOS transistor having a source-drain path connected between said first and second potential supply terminals and having a gate coupled to the drain of said first transistor;

said differential amplifier circuit comprising a third p-channel MOS transistor for constant current supply connected at the source to said first potential supply terminal, and at the gate to the drain terminal of said first transistor, a fourth amplifying p-channel MOS transistor connected at the source to the drain of said third transistor and at the gate to said first input, a fifth amplifying p-channel MOS transistor connected at the source to the drain of said third transistor, and at the gate to said second input, sixth and eighth load n-channel MOS transistors connected in series between the drain terminal of said fourth transistor and said second potential supply terminal, and seventh and ninth n-channel MOS transistors connected in series between the drain terminal of said fifth transistor and said second potential supply terminal, the gates of said sixth to ninth transistors being connected commonly to the first output terminal of said differential amplifier;

said circuit threshold voltage matching circuit being comprised of a tenth p-channel MOS transistor for constant current supply connected at the source to said first potential supply terminal and at the gate to the drain terminal of said first transistor, an eleventh p-channel MOS transistor connected between the drain of said tenth transistor and the output terminal of said matching circuit and at the gate to said second input, a twelfth p-channel MOS transistor connected between the drain of said tenth transistor and said output terminal and at the gate to said first input, and a thirteenth load n-channel MOS transistor connected between said output terminal and said second potential supply terminal, and at the gate to the first output terminal of said differential amplifier circuit; and said linear amplifier circuit comprising first and second amplifier circuits in which said first amplifier has a fourteenth p-channel MOS transistor for constant current supply connected at the source to said first potential supply terminal and at the gate to the drain of said first transistor, a fifteenth amplifying p-channel MOS transistor connected at the source to the drain of said fourteenth transistor and at the gate to the second output terminal of said differential amplifier, a sixteenth amplifying n-channel MOS transistor connected between the output terminal of said first amplifier circuit and said second potential supply terminal and at the gate to the second output terminal of said differential amplifier circuit, and a seventeenth MOS transistor connected between the drain of said fifteenth transistor and the output terminal of said first amplifier, and said second amplifier circuit having an eighteenth p-channel MOS transistor for constant current supply connected at the source to said first potential supply terminal and at the gate to the drain of said first transistor, a nineteenth MOS transistor connected at the source to the drain of said eighteenth transistor and at the gate to the output of said first amplifier circuit, a twentieth amplifying MOS transistor connected between the output terminal of said second amplifier circuit and said second potential supply terminal and at the gate to the output of said first amplifier circuit, and a twenty-first n-channel load MOS transistor connected between the drain of said nineteenth transistor and the output terminal of said second amplifier circuit and at the gate to the output to said matching circuit.

9. An operational amplifier comprising:

a constant current source circuit;

a differential amplifier circuit which is constructed by using MOS (metal oxide semiconductor) transistors, connected between a first potential supply terminal and a second potential supply terminal coupled to said constant current source circuit, and supplied with first and second inputs;

a linear amplifier circuit which is constructed by using MOS transistors, connected between said first and second potential supply terminals, and receives the output of said differential amplifier circuit to produce an output;

an offset compensating circuit which is connected to said first and second potential supply terminals and said differential amplifier, for keeping substantially constant the output DC level of said differential amplifier circuit in response to change of the first and second input DC levels of said differential amplifier;

a circuit threshold voltage matching circuit which is connected to said first and second potential supply terminals, said differential amplifier circuit and said linear amplifier circuit for stabilizing the output of said linear amplifier circuit in accordance with the output level of said differential amplifier circuit; and wherein:

(a) said constant current source circuit includes a first p-channel MOS transistor which is connected at the source to said first potential supply terminal and at the drain terminal to the gate of the same transistor;

(b) said differential amplifier circuit comprises a second p-channel MOS transistor for constant current supply which is connected at the source terminal to said first potential supply terminal and at the gate to the drain terminal of said first transistor, a third amplifying p-channel MOS transistor which is connected between the drain terminal of said second transistor and the first output terminal of said differential amplifier circuit and at the gate to said first input, a fourth amplifying p-channel MOS transistor which is connected between the drain terminal of said second transistor and the second output terminal of said differential amplifier circuit and at the gate to said second input, a fifth load n-channel MOS transistor connected between said first output terminal and said second potential supply terminal, a sixth load n-channel MOS transistor which is connected between said second output terminal and said second potential supply terminal and at the gate to the gate of said fifth transistor;

(c) said offset compensating circuit comprises a seventh p-channel MOS transistor for constant current supply which is connected at the source to said first potential supply terminal and at the gate to the drain of said first transistor, an eighth amplifying p-channel MOS transistor which is connected between the drain of said seventh transistor and the output terminal of said compensating circuit and at the gate to said second input, a ninth amplifying p-channel MOS transistor which is connected between the drain of said seventh transistor and the output terminal of said compensating circuit and at the gate to said first input, a tenth load n-channel MOS transistor which is connected between said output terminal and said second potential supply terminal and at the gate to the output terminal of said compensating circuit and the gates of said fifth and sixth transistors;

(d) said circuit threshold voltage matching circuit comprises an eleventh load p-channel MOS transistor which is connected between said first potential supply terminal and the output terminal of said matching circuit and at the drain to the gate of the same transistor, and a twelfth drive n-channel MOS transistor which is connected between said output terminal and said second potential supply terminal and at the gate to the first output of said differential amplifier circuit; and (e) said linear amplifier circuit comprises a thirteenth load p-channel MOS transistor which is connected between said first potential supply terminal and the output terminal of said linear amplifier circuit and at the gate to the output of said matching circuit, and a fourteenth n-channel MOS transistor which is connected between said output terminal and said second potential terminal and at the gate to the second output of said differential amplifier circuit.

10. An operational amplifier comprising:
a constant current source circuit,
a differential amplifier circuit which is constructed by using MOS (metal oxide semiconductor) transistors, connected between a first potential supply terminal and a second potential supply terminal coupled to said constant current source circuit, and supplied with first and second inputs;

a linear amplifier circuit which is constructed by using MOS transistors, connected between said first and second potential supply terminals, and receives the output of said differential amplifier circuit to produce an output;

an offset compensating circuit which is connected to said first and second potential supply terminals and said differential amplifier, for keeping substantially constant the output DC level of said differential amplifier circuit in response to change of the first and second input DC levels of said differential amplifier; and a circuit threshold voltage matching circuit which is connected to said first and second potential supply terminals, said differential amplifier circuit and said linear amplifier circuit for stabilizing the output of said linear amplifier circuit in accordance with the output level of said differential amplifier circuit; and wherein:

(a) said constant current source circuit includes a first n-channel MOS transistor which is connected at the source to said second potential supply terminal and at the drain terminal to the gate of the same transistor;

(b) said differential amplifier circuit comprises a second n-channel MOS transistor for constant current supply which is connected at the source terminal to said second potential supply terminal and at the gate to the drain terminal of said first transistor, a third amplifying n-channel MOS transistor which is connected between the drain terminal of said second transistor and the first output terminal of said differential amplifier circuit and at the gate to said first input, a fourth amplifying n-channel MOS transistor which is connected between the drain terminal of said second transistor and the second output terminal of said differential amplifier circuit and at the gate to said second input, a fifth load p-channel MOS transistor connected between said first output terminal and said first potential supply terminal, a sixth load p-channel MOS transistor which is connected between said second output terminal and said first potential supply terminal and at the gate to the gate of said fifth transistor;

(c) said offset compensating circuit comprises a seventh n-channel MOS transistor for constant current supply which is connected at the source to said second potential supply terminal and at the gate to the drain of said first transistor, an eighth amplifying n-channel MOS transistor which is connected between the drain of said seventh transistor and the output terminal of said compensating circuit and at the gate to said second input, a ninth amplifying n-channel MOS transistor which is connected between the drain of said seventh transistor and the output terminal of said compensating circuit and at the gate to said first input, a tenth load p-channel MOS transistor which is connected between said output terminal and said first potential supply terminal and at the gate to the output terminal of said compensating circuit and the gates of said fifth and sixth transistors;

(d) said circuit threshold voltage matching circuit comprises an eleventh n-channel MOS load transistor which is connected between said second potential supply terminal and the output terminal of said matching circuit and at the drain to the gate of the same transistor, and a twelfth drive p-channel MOS transistor which is connected between said output terminal and said first potential supply terminal and at the gate to the first output of said differential amplifier circuit; and (e) said linear amplifier circuit comprises a thirteenth load n-channel MOS transistor which is connected between said second potential supply terminal and the output terminal of said linear amplifier circuit and at the gate to the output of said matching circuit, and a fourteenth drive p-channel MOS transistor which is connected between said output terminal and said first potential supply terminal and at the gate to the second output of said differential amplifier circuit.

* * * * *